(12) United States Patent
Samuels

(10) Patent No.: US 10,210,946 B2
(45) Date of Patent: Feb. 19, 2019

(54) ELECTRONIC SWITCH EXHIBITING LOW OFF-STATE LEAKAGE CURRENT

(71) Applicant: Analog Devices, Inc., Norwood, MA (US)

(72) Inventor: Howard R. Samuels, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 110 days.

(21) Appl. No.: 15/338,278

(22) Filed: Oct. 28, 2016

(65) Prior Publication Data

US 2018/0013417 A1 Jan. 11, 2018

Related U.S. Application Data

(60) Provisional application No. 62/360,080, filed on Jul. 8, 2016.

(51) Int. Cl.
| | |
|---|---|
| *H03K 17/687* | (2006.01) |
| *G11C 27/02* | (2006.01) |
| *H03K 17/10* | (2006.01) |
| *H03K 17/693* | (2006.01) |

(52) U.S. Cl.
CPC .......... *G11C 27/02* (2013.01); *H03K 17/102* (2013.01); *H03K 17/693* (2013.01); *H03K 2217/0036* (2013.01); *H03K 2217/0054* (2013.01)

(58) Field of Classification Search
CPC ............ H03K 17/063; H03K 17/0822; H03K 17/04123; H03K 2217/0036; H03K 17/687

USPC .................................................. 327/427, 434
See application file for complete search history.

(56) References Cited

U.S. PATENT DOCUMENTS

| | | | |
|---|---|---|---|
| 5,994,947 A | 11/1999 | Sobolewski et al. | |
| 6,552,576 B1 * | 4/2003 | Bobba ................ | H03K 17/6874 326/113 |
| 6,603,333 B2 * | 8/2003 | Vinh .................. | H03K 19/0963 326/95 |
| 7,436,221 B2 | 10/2008 | O'Halloran et al. | |
| 7,812,646 B2 | 10/2010 | Augustyniak et al. | |
| 7,973,570 B2 | 7/2011 | Pigott et al. | |
| 8,289,066 B2 * | 10/2012 | Guo .................. | H03K 17/04123 327/419 |
| 8,625,370 B2 * | 1/2014 | Yamagami .......... | H01L 27/0207 327/112 |
| 8,810,311 B2 | 8/2014 | Ivanov et al. | |
| 8,847,629 B2 | 9/2014 | Landoulsi et al. | |

(Continued)

*Primary Examiner* — Quan Tra
(74) *Attorney, Agent, or Firm* — Wolf, Greenfield & Sacks, P.C.

(57) ABSTRACT

According to some aspects, a low-leakage switch is provided. In some embodiments, the low-leakage switch includes a plurality of pass transistors in series that selectively couple two ports of the low-leakage switch and a node biasing circuit coupled to a node between the plurality of pass transistors. In these embodiments, the node biasing circuit may adjust a voltage at the node to change the gate-to-source voltage of the pass transistors and, thereby, reduce the leakage current through the pass transistors when the low-leakage switch is turned off. The node biasing circuit may also include circuitry to reduce the leakage current introduced by the node biasing circuit into the node when the low-leakage switch is turned on.

20 Claims, 11 Drawing Sheets

(56) References Cited

U.S. PATENT DOCUMENTS

2010/0013541 A1\* 1/2010 Balboni .......... H03K 17/04106
                                                    327/427
2017/0104481 A1\* 4/2017 Ko ................. A61B 8/4483

\* cited by examiner

ELECTRONIC SWITCH EXHIBITING LOW OFF-STATE LEAKAGE CURRENT

CROSS-REFERENCE TO RELATED APPLICATIONS

This application claims the benefit under 35 U.S.C. § 119(e) of U.S. provisional patent application Ser. No. 62/360,080 titled "ELECTRONIC SWITCH EXHIBITING LOW OFF-STATE LEAKAGE CURRENT," filed Jul. 8, 2016, which is hereby incorporated herein by reference in its entirety.

FIELD OF THE DISCLOSURE

The present disclosure relates to electronic switch configurations which exhibit low off-state leakage current.

BACKGROUND

Solid state switches may include a transistor that functions as a variable resistance between the input and output terminals of the switch. When the switch is turned on, a first control signal is applied to a gate terminal of the transistor to reduce the resistance of the transistor and allow current flow between the input and output terminals of the switch. When the switch is turned off, a second control signal is applied to the gate terminal of the transistor to increase the resistance of the transistor and impede current flow between the input and output terminals of the switch.

SUMMARY OF THE DISCLOSURE

According to some aspects, a low-leakage switch is provided. In some embodiments, the low-leakage switch includes a plurality of pass transistors in series that selectively couple two ports of the low-leakage switch and a node biasing circuit coupled to a node between the plurality of pass transistors. In these embodiments, the biasing circuit may adjust a voltage at the node to change the gate-to-source voltage of the pass transistors and, thereby, reduce the leakage current through the pass transistors when the low-leakage switch is turned off. The node biasing circuit may also include circuitry to reduce the leakage current introduced by the node biasing circuit into the node when the low-leakage switch is turned on.

According to at least one aspect, a low-leakage switch is provided. The low-leakage switch includes a first port, a second port, a plurality of pass transistors including at least two re-type pass transistors coupled between the first port and the second port, and a node-biasing circuit coupled to a node between the at least two n-type pass transistors. The node-biasing circuit may be configured to adjust a voltage at the node responsive to the at least two n-type pass transistors being turned off. The node-biasing circuit may include a first p-type transistor coupled to the node, a second p-type transistor coupled in series with the first p-type transistor, and an n-type transistor having a terminal coupled between the first and second p-type transistors.

According to at least one aspect, a low-leakage switch is provided. The low-leakage switch includes a first port, a second port, a plurality of pass transistors including at least two p-type pass transistors coupled between the first port and the second port, and a node-biasing circuit coupled to a node between the at least two p-type pass transistors. The node biasing circuit may be configured to adjust a voltage at the node responsive to the at least two p-type pass transistors being turned off. The node biasing circuit may include a first n-type transistor coupled to the node, a second n-type transistor coupled in series with the first n-type transistor, and a p-type transistor having a terminal coupled between the first and second n-type transistors.

According to at least one aspect, a sample and hold circuit is provided that includes a sample mode of operation and a hold mode of operation. The sample and hold circuit includes a first port, a second port, a capacitor coupled to the second port, and a switch coupled between the first port and the capacitor. The switch may include a plurality of pass transistors coupled between the first port and the second port and a node-biasing circuit coupled to a node between at least two pass transistors of the plurality of pass transistors. The node biasing circuit may be configured to adjust a voltage at the node responsive to the at least two pass transistors being turned off. The node-biasing circuit may include a first transistor coupled to the node, a second transistor coupled in series with the first transistor, and a third transistor having a terminal coupled between the first and second transistors.

According to at least one aspect, a low-leakage switch is provided. The low-leakage switch may include a first port, a second port, a plurality of pass transistors coupled between the first port and the second port, and a node-biasing circuit coupled to a node between at least two pass transistors of the plurality of pass transistors. The node-biasing circuit may be configured to adjust a voltage at the node such that a terminal of at least one of the plurality of pass transistors that is coupled to the node becomes a drain terminal responsive to the plurality of pass transistors being turned off.

According to at least one aspect, a sample and hold circuit including a sample mode of operation and a hold mode of operation is provided. The sample and hold circuit may include a first port, a second port, a capacitor coupled to the second port, and a switch coupled between the first port and the capacitor. The switch may include a plurality of pass transistors coupled between the first port and the capacitor in addition to a node-biasing circuit coupled to a node between at least two of the plurality of pass transistors and configured to adjust a voltage at the node such that a terminal of at least one of the plurality of pass transistors that is coupled to the node becomes a drain terminal responsive to the sample and hold circuit being in the hold mode of operation.

According to at least one aspect, a method of operating a low-leakage switch is provided. The method may include receiving a first control signal to open the low-leakage switch, turning off a plurality of pass transistors responsive to receiving the first control signal, and adjusting a voltage at a node between at least two pass transistors of the plurality of pass transistors such that a terminal of at least one of the plurality of pass transistors that is coupled to the node becomes a drain terminal responsive to receiving the first control signal to reduce a leakage current in at least one of the plurality of pass transistors.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
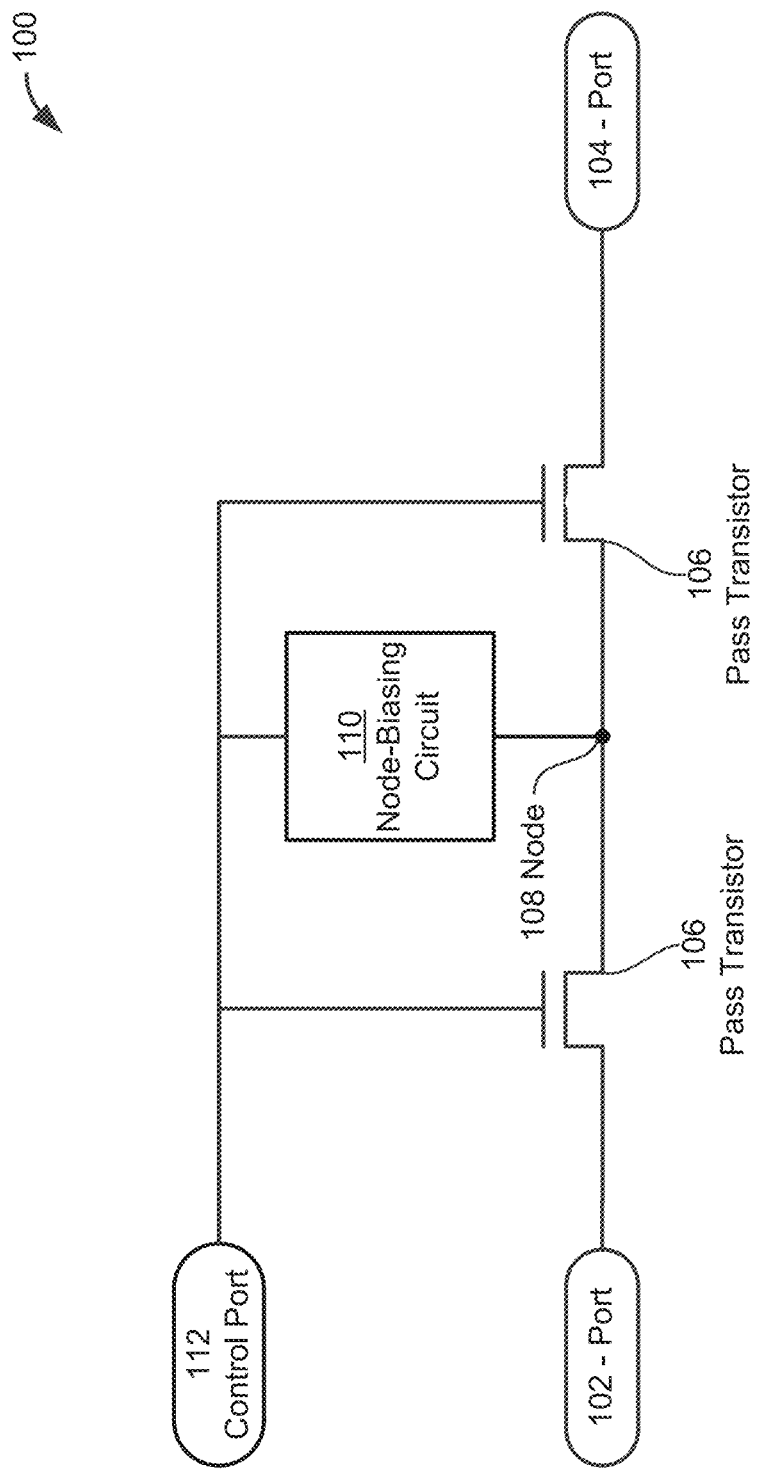
FIG. 1 is a diagram showing an example low-leakage switch, according to some embodiments.

According to some aspects, electronic switches which exhibit reduced off-state leakage current (referred to herein simply as "leakage current") compared to conventional switches are provided. A conventional switch generally includes a field effect transistor (FET) that is turned on and off by coupling the gate terminal to the most positive voltage (e.g., a supply voltage) or the most negative voltage (e.g., ground). The inventor has appreciated that such a conventional approach allows a substantial amount of leakage current in the FET under certain operating conditions. This leakage current may negatively impact the operation of devices coupled to the conventional switch and/or increase the power consumption of the electronic device employing the conventional switch. For example, the leakage current in an n-type FET may be substantial when both the gate and source terminals of the n-type FET are coupled to ground. In another example, the leakage current in a p-type FET may be substantial when both the gate and source terminals of the p-type FET are coupled to a supply voltage. Further, the inventor has appreciated that the leakage current in these FETs is a function of the gate-to-source voltage of the FET and that the leakage current can be reduced by changing the gate-to-source voltage of FET. Accordingly, aspects of the present disclosure provide low-leakage switches that adjust a voltage at a node between a pair of FETs coupled in series to change the gate-to-source voltage of at least one of the FETs to reduce the leakage current in the switch.

In some embodiments, the low-leakage switch includes two n-type metal-oxide semiconductor (NMOS) transistors that are coupled in series between two terminals of the switch. The leakage current in these NMOS transistors may decrease as the gate-to-source voltage decreases. In these embodiments, the low-leakage switch may further include a node-biasing circuit coupled to a node that is between the two NMOS transistors. The node-biasing circuit may be configured to increase the voltage at the node above the voltage at the gate terminals of the NMOS transistors when the NMOS transistors are off. Thereby, the node-biasing circuit may drive the gate-to-source voltage of the NMOS transistors below zero to reduce the leakage current.

It should be appreciated that the low-leakage switches described herein may employ p-type metal-oxide-semiconductor (PMOS) transistors in place of the NMOS transistors between the two terminals of the low-leakage switch in some embodiments. The leakage current in these PMOS transistors may decrease as the gate-to-source voltage increases. In these embodiments, the node-biasing circuit may be configured to decrease the voltage at the node between the PMOS transistors below the voltage at the gate terminals of the PMOS transistors when the PMOS transistors are off. Thereby, the node-biasing circuit may drive the gate-to-source voltage of the PMOS transistors above zero to reduce the leakage current.

The aspects and embodiments described above, as well as additional aspects and embodiments, are described further below. These aspects and/or embodiments may be used individually, all together, or in any combination of two or more, as the application is not limited in this respect.

FIG. 1 shows an example low-leakage switch 100, according to some embodiments. The low-leakage switch 100 selectively couples the port 102 to the port 104 based on a control signal received at control port 112. As shown, the low-leakage switch 100 includes two pass transistors 106 coupled in series between the ports 102 and 104, a node 108 between the two pass transistors 106, and a node-biasing circuit 110 coupled to the node 108.

The pass transistors 106 may be transistors that control a magnitude of current between the port 102 and the port 104 to open or close the low-leakage switch 100. The pass transistors 106 may be NMOS or PMOS transistors that each include a drain terminal and a source terminal coupled between the port 102 and the port 104 in addition to a gate terminal coupled to the control port 112. In some embodiments, the pass transistors 106 may function as variable impedances that may be controlled based on the voltage between the gate and source terminals of the pass transistor 106. In these embodiments, the control port 112 may apply a first voltage to the gate terminals of the pass transistors 106 to turn on the pass transistors 106 and, thereby, reduce the impedance of the pass transistors 106 to allow current to flow between the ports 102 and 104. Conversely, the control port 112 may apply a second voltage to the gate terminals of the pass transistors to turn off the pass transistors 106 and, thereby, increase the impedance of the pass transistors 106 to impede current flow between the ports 102 and 104.

The node-biasing circuit 110 may adjust the voltage at the node 108 to reduce the leakage current in the pass transistors 106 when the pass transistors 106 are turned off. In some embodiments, the pass transistors 106 may be NMOS transistors and the leakage current in the NMOS transistors may increase as the gate-to-source voltage of the NMOS transistors increase. In these embodiments, the relationship between the gate-to-source voltage $V_{gs}$ of the NMOS transistors and the leakage current $I_{ds}$ of the NMOS transistors may be represented by equation (1) below.

$$I_{ds} = I_0 \left[1 - e^{\left(-\frac{V_{ds}}{v_t}\right)}\right] e^{\left(\frac{V_{gs} - V_{th} - V_{off}}{nv_t}\right)} \qquad (1)$$

In equation (1), the term $v_t$ is the thermal voltage of the NMOS transistor, the term $V_{th}$ is the threshold voltage of the NMOS transistor, the term $V_{ds}$ is the drain-to-source voltage of the NMOS transistor, and the term $V_{gs}$ is the gate-tosource voltage of the NMOS transistor. The terms $I_0$, n, and $V_{off}$ are constants that are determined based on the construction of the NMOS transistor. As shown in equation (1), the leakage current $I_{ds}$ can be reduced by driving the gate-to-source voltage $V_{gs}$ below zero. In particular, driving the gate-to-source voltage $V_{gs}$ below zero causes the exponential function including the gate-to-source voltage $V_{gs}$ to shrink and reduce the total leakage current $I_{ds}$. The node-biasing circuit 110 may reduce the gate-to-source voltage $V_{gs}$ of at least one of the NMOS transistor below zero by increasing voltage at the node 108 when the NMOS transistors are turned off. Thereby, the voltage at the source terminal of the NMOS transistor may be higher than the voltage applied to the gate terminal of the NMOS transistor to create a negative gate-to-source voltage $V_{gs}$.

It should be appreciated that the function of the terminals of the pass transistors 106 that are in series with the ports 102 and 104 may change during operation of the low-leakage switch 100. For example, either of the terminals in series with the ports 102 and 104 may function as the drain terminal or the source terminal depending upon the voltage levels applied to the transistor. Thereby, the voltage adjustment applied at the node 108 by the node-biasing circuit 110 may change which terminals of the pass transistors 106 are functioning as the source and drain terminals. For example, the node-biasing circuit 110 may adjust a voltage at the node 108 such that a terminal of at least one of the plurality of pass transistors that is coupled to the node becomes a drain terminal responsive to the plurality of pass transistors 106 being turned off. In embodiments where the pass transistors 106 are NMOS transistors, the terminal that is coupled to the lower voltage may become the source terminal and the terminal that is coupled to the higher voltage may become the drain terminal. In these embodiments, the node-biasing circuit 110 may couple the node 108 to a supply voltage when the pass transistors 106 are turned off. Thereby, the node-biasing circuit 110 may cause the terminal of one or more of the pass transistors 106 that is coupled to the node 108 to become the drain terminal. For example, the voltage at the port 102 may be 1 volt, the voltage at the control port 112 may be at 0 volts, and the voltage at the node 108 may be at 1.8 volts. In this example, the pass transistor 106 that is coupled between the port 102 and the node 108 has a source terminal coupled to the port 102, a drain terminal coupled to the node 108, and a gate-to-source voltage of −1 volt. Conversely for PMOS transistors, the terminal that is coupled to the higher voltage may become the source terminal and the terminal that is coupled to the lower voltage may become the drain terminal. In embodiments where the pass transistors 106 are PMOS transistors, the node-biasing circuit 110 may couple the node 108 to ground when the pass transistors 106 are turned off. Thereby, the node-biasing circuit 110 may cause the terminal of one or more of the pass transistors 106 that is coupled to the node 108 to become the drain terminal. For example, the voltage at the port 102 may be 1 volt, the voltage at the control port 112 may be at 1.8 volts, and the voltage at the node 108 may be at 0 volts. In this example, the pass transistor 106 that is coupled between the port 102 and the node 108 has a source terminal coupled to the port 102, a drain terminal coupled to the node 108, and a gate-to-source voltage of 0.8 volts.

The node-biasing circuit 110 may be implemented in any of a variety of fashions. An example of such an implementation is shown by low-leakage switch 200A in FIG. 2A. As shown, the pass transistors 106 are NMOS transistors and the node-biasing circuit 110 is implemented as a PMOS transistor 202.

The transistor 202 in the node-biasing circuit 110 turns on to couple the node 108 to the supply voltage $V_{dd}$ when the pass transistors 106 are turned off. Thereby, the voltage at the node 108 is increased to drive the gate-to-source voltage of at least one of the NMOS transistors negative and reduce the leakage current between the ports 102 and 104. Implementing the node-biasing circuit 110 in this fashion may advantageously allow the same control signal from the control port 112 to control all of the transistors because the PMOS transistor operates in a complementary fashion relative to the NMOS transistors in the signal path between the ports 102 and 104.

It should be appreciated that the pass transistors 106 of the low-leakage switch 200A may be implemented as PMOS transistors instead of NMOS transistors. In these implementations, the leakage current in the pass transistors 106 may be reduced by increasing the gate-to-source voltage of the PMOS transistors. An example of such a low-leakage switch is shown by low-leakage switch 200B in FIG. 2B. As shown, the pass transistors 106 are PMOS transistors and the node-biasing circuit 110 is implemented as an NMOS transistor 204.

The transistor 204 in the node-biasing circuit 110 turns on to couple the node 108 to ground when the pass transistors 106 are turned off. Thereby, the voltage at the node 108 is reduced to increase the gate-to-source voltage of at least one of the PMOS transistors and reduce the leakage current between the ports 102 and 104. Implementing the node-biasing circuit 110 in this fashion may advantageously allow the same control signal from the control port 112 to control all of the transistors because the NMOS transistor operates in a complementary fashion relative to the PMOS transistors in the signal path between the ports 102 and 104.

Figure 2A:
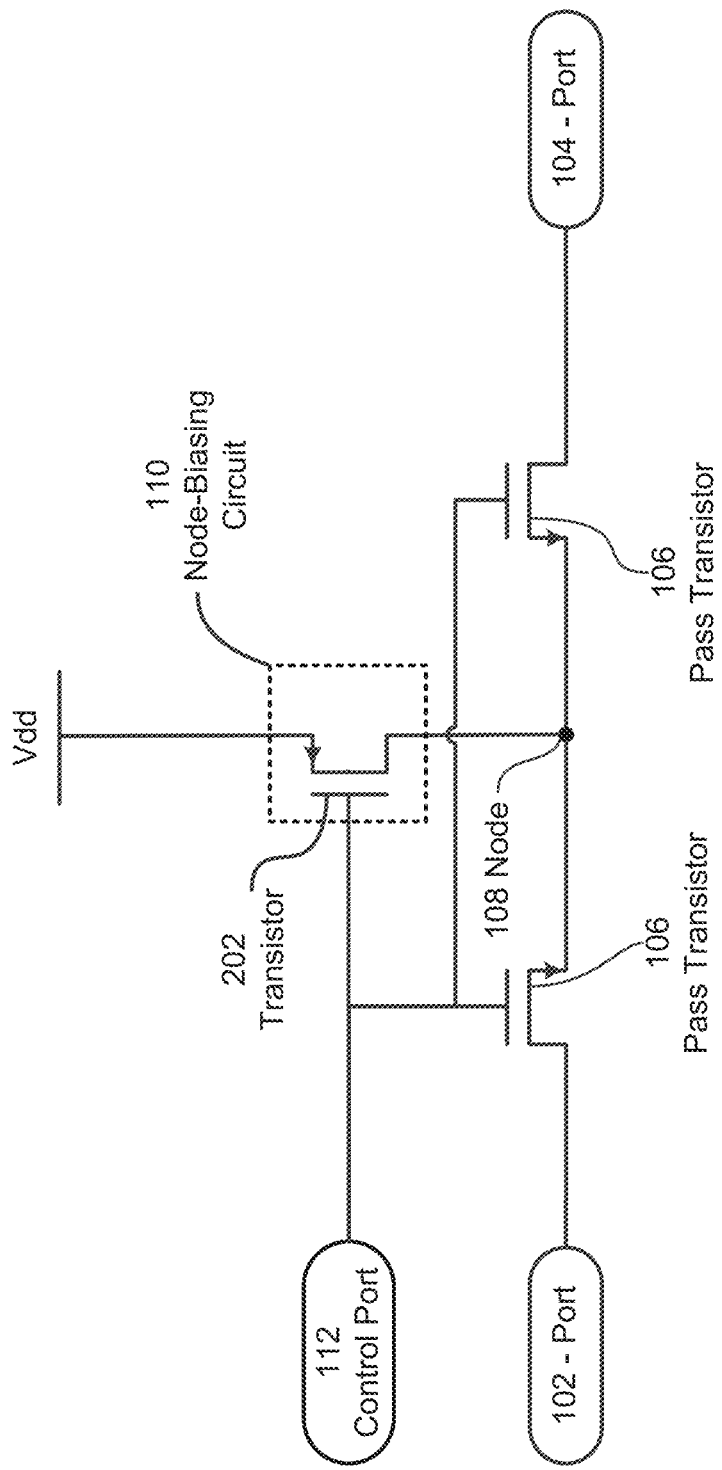
FIG. 2A is a diagram showing an example implementation of the low-leakage switch shown in FIG. 1, according to some embodiments.
Figure 2B:
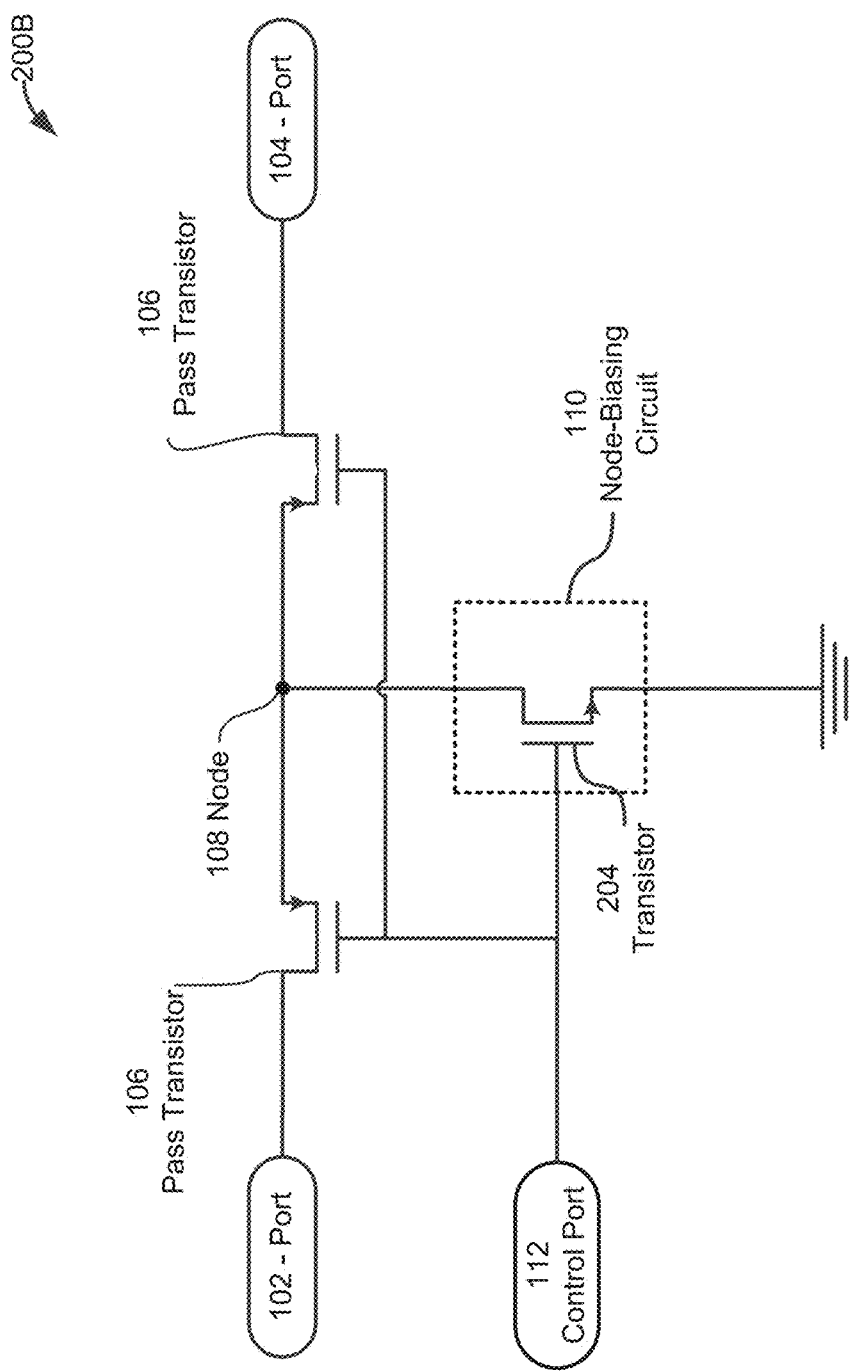
FIG. 2B is a diagram showing another example implementation of the low-leakage switch shown in FIG. 1, according to some embodiments.
Figure 3A:
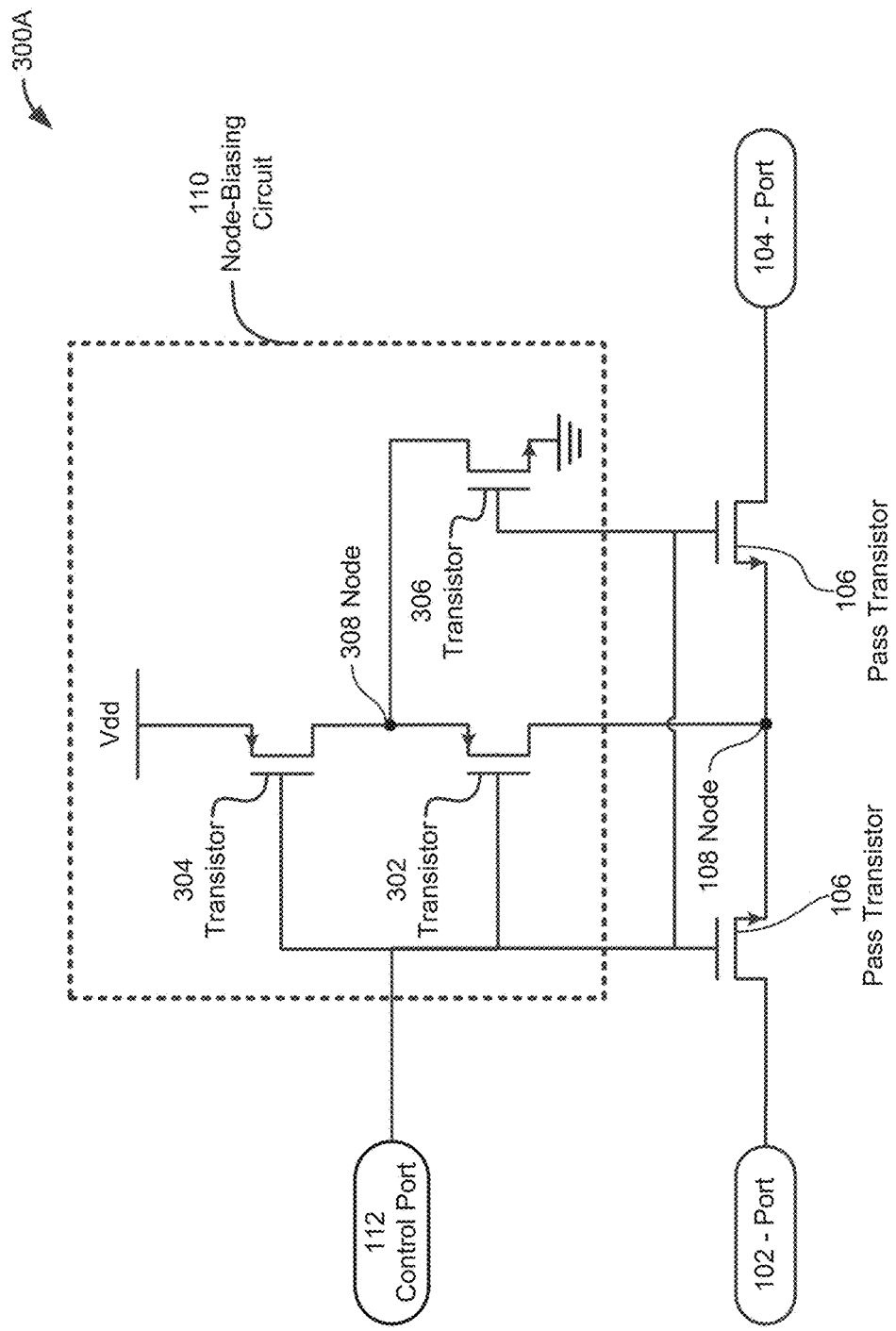
FIG. 3A is a diagram showing another example implementation of the low-leakage switch shown in FIG. 1, according to some embodiments.

The node-biasing circuits 110 illustrated in FIGS. 2A and 2B may introduce some leakage current from the supply voltage $V_{dd}$ (or allow some leakage current to ground) into the signal path between the ports 102 and 104 when the low-leakage switch is closed. In some embodiments, the leakage current that otherwise would be introduced into the signal path by the node-biasing circuit 110 when the low-leakage switch is closed may be eliminated with the addition of two transistors to the node-biasing circuit 110. An example of such a low-leakage switch is shown by low-leakage switch 300A in FIG. 3A. As shown, the low-leakage switch 300A includes NMOS pass transistors 106, a node 108, and a node-biasing circuit 110 including a node 308, an NMOS transistor 306, and PMOS transistors 302 and 304. Relative to the node-biasing circuit 110 in low-leakage switch 200A shown in FIG. 2A, the low-leakage switch 300A adds a second PMOS transistor 304 and an NMOS transistor 306.

The PMOS transistors 302 and 304 in the node-biasing circuit 110 function in a similar (or same) fashion as the PMOS transistor 202 described above with reference to FIG. 2A. The additional NMOS transistor 306 that is coupled between node 308 and ground turns on when the PMOS transistors 302 and 304 are turned off. Thereby, the node 308 is coupled to ground to increase the gate-to-source voltage of the PMOS transistor 302 and reduce the leakage current through 302. Further, the leakage current through PMOS transistor 304 may be diverted through the NMOS transistor 306 to ground. Accordingly, the leakage current introduced by the biasing circuit 110 into the signal path between the ports 102 and 104 when the switch is open is reduced.

Figure 3B:
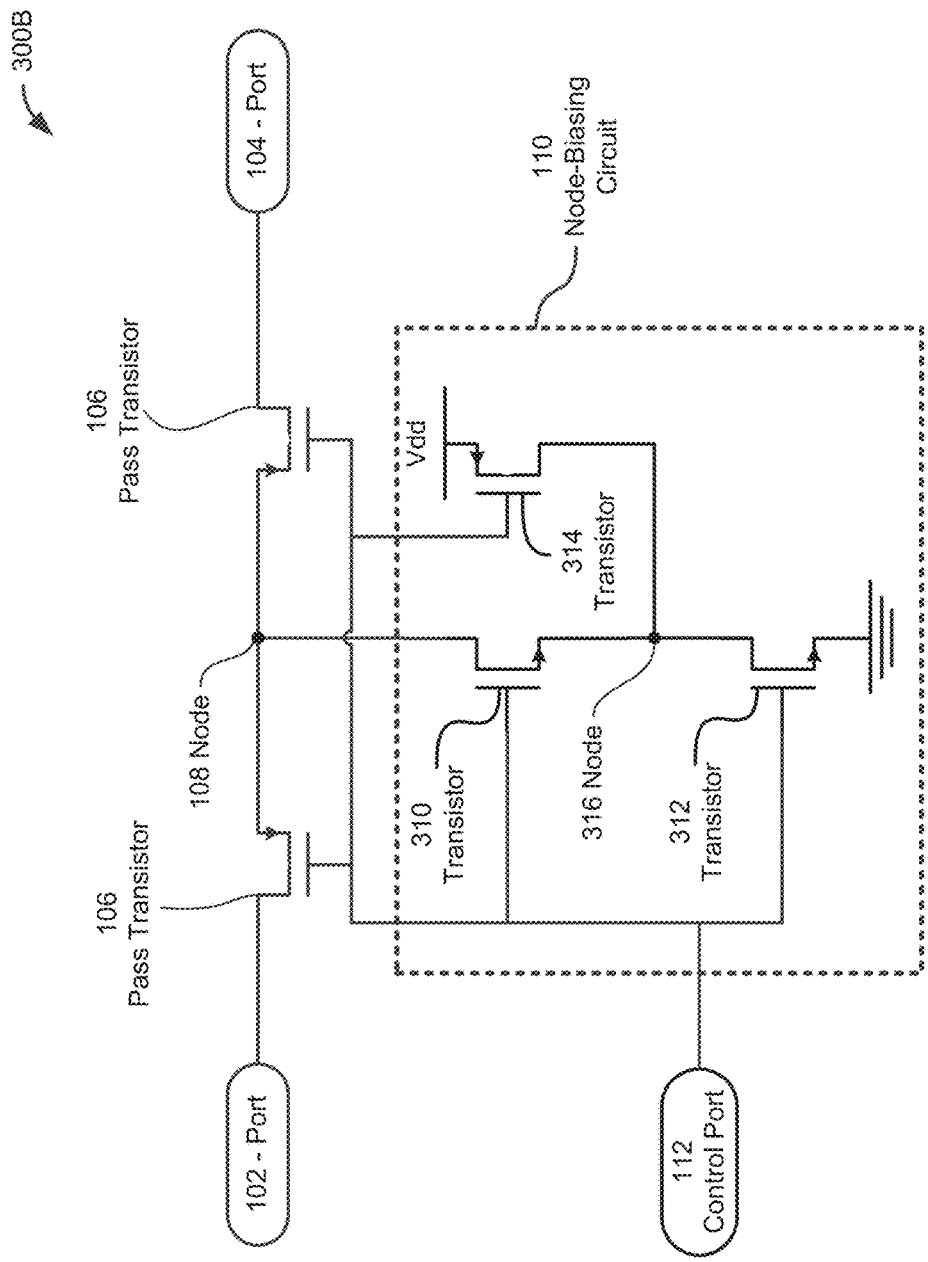
FIG. 3B is a diagram showing another example implementation of the low-leakage switch shown in FIG. 1, according to some embodiments.

It should be appreciated that the pass transistors 106 of the low-leakage switch 300A may be implemented as PMOS transistors instead of NMOS transistors. An example of such a low-leakage switch is shown by low-leakage switch 300B in FIG. 3B. As shown, the pass transistors 106 are PMOS transistors and the node-biasing circuit 110 includes a node 316, NMOS transistors 310 and 312, and PMOS transistor 314. Relative to the node-biasing circuit 110 in low-leakage switch 200B shown in FIG. 2B, the low-leakage switch 300B adds a second NMOS transistor 312 and a PMOS transistor 314.

The NMOS transistors 310 and 312 in the node-biasing circuit 110 function in a similar (or same) fashion as the NMOS transistor 204 described above with reference to FIG. 2B. The additional PMOS transistor 314 that is coupled between node 316 and supply voltage $V_{dd}$ turns on when the NMOS transistors 310 and 312 are turned off. Thereby, the node 316 is coupled to a supply voltage $V_{dd}$ to drive the gate-to-source voltage of the NMOS transistor 310 negative and reduce the leakage current through 310. Accordingly, the leakage current introduced by the biasing circuit 110 into the signal path between the ports 102 and 104 when the switch is open is reduced.

In some embodiments, the low-leakage switch may be implemented as a complementary metal-oxide-semiconductor (CMOS) device. In these embodiments, the low-leakage switch 100 may employ both PMOS and NMOS transistors as pass transistors 106 between the ports 102 and 104. For example, the low-leakage switch may be formed by coupling the low-leakage switch 200A shown in FIG. 2A in parallel with the low-leakage switch 200B shown in FIG. 2B. In this example, the port 102 of the low-leakage switches 200A and 200B may be coupled together and the port 104 of the low-leakage switches 200A and 200B may also be coupled together. The control ports 112 of the low-leakage switches 102 and 104 may receive complementary control signals to turn on the NMOS pass transistors of the low-leakage switch 200A simultaneously with the PMOS transistors of the low-leakage switch 200B. It should be appreciated that a CMOS device may also be formed by coupling the low-leakage switch 300A shown in FIG. 3A in parallel with the low-leakage switch 300B shown in FIG. 3B in a similar fashion.

Figure 4:
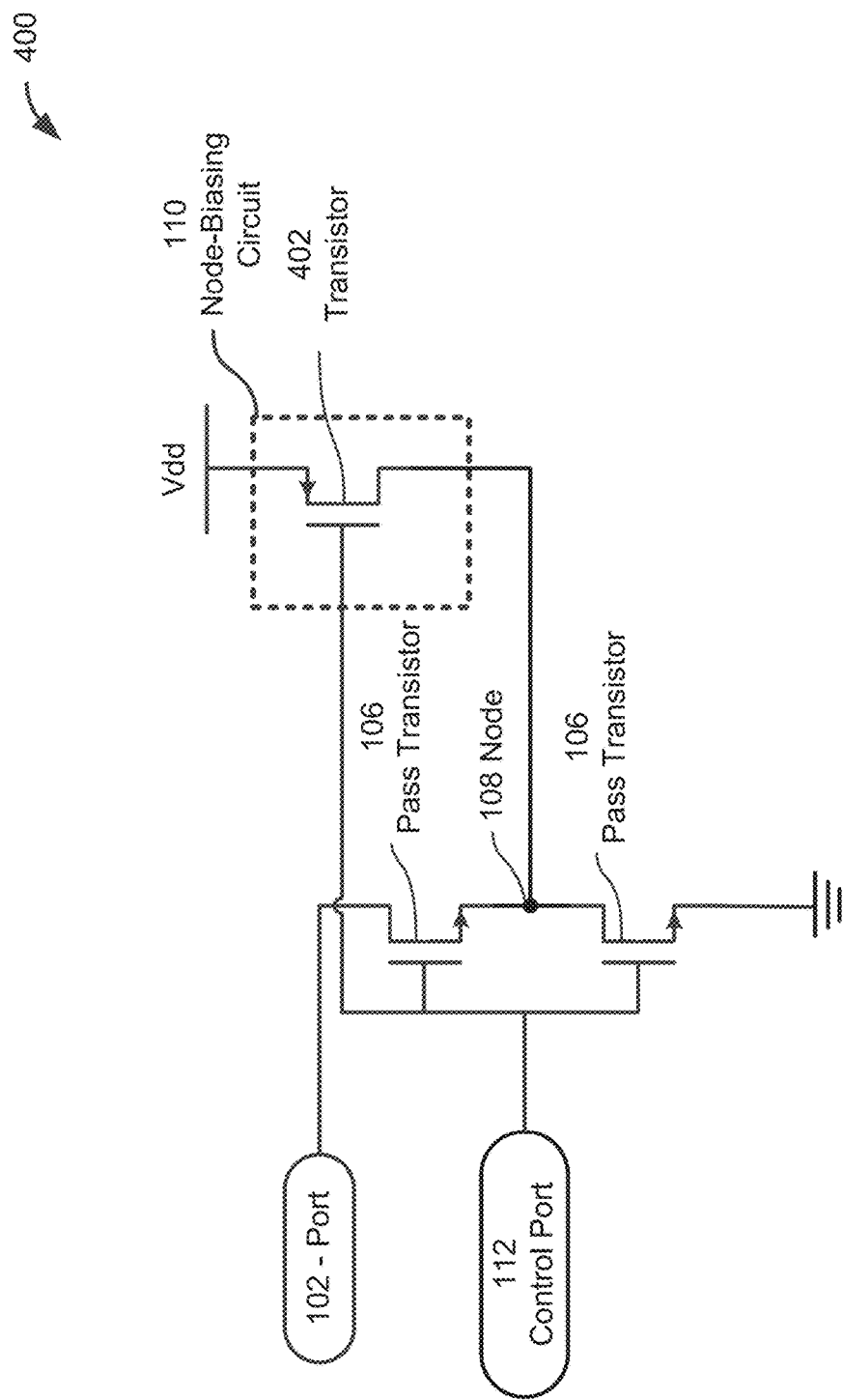
FIG. 4 is a diagram showing an example low-leakage pulldown switch, according to some embodiments.

In some embodiments, the low-leakage switches disclosed herein may be implemented as pulldown switches. In these embodiments, the port 102 may be coupled to the node that may be pulled to ground by the pulldown switch and the port 104 may be coupled to ground. Thereby, the pulldown switch may selectively couple a node to ground with minimal leakage current from the node to ground when the switch is turned off. An example of such a pulldown switch is shown by low-leakage pulldown switch 400 in FIG. 4. As shown, the pulldown switch 400 includes two NMOS pass transistors 106 coupled between the port 102 and ground, a node 108, and a node-biasing circuit 110 including a PMOS transistor 402 coupled between the supply voltage $V_{dd}$ and the node 108.

Figure 5:
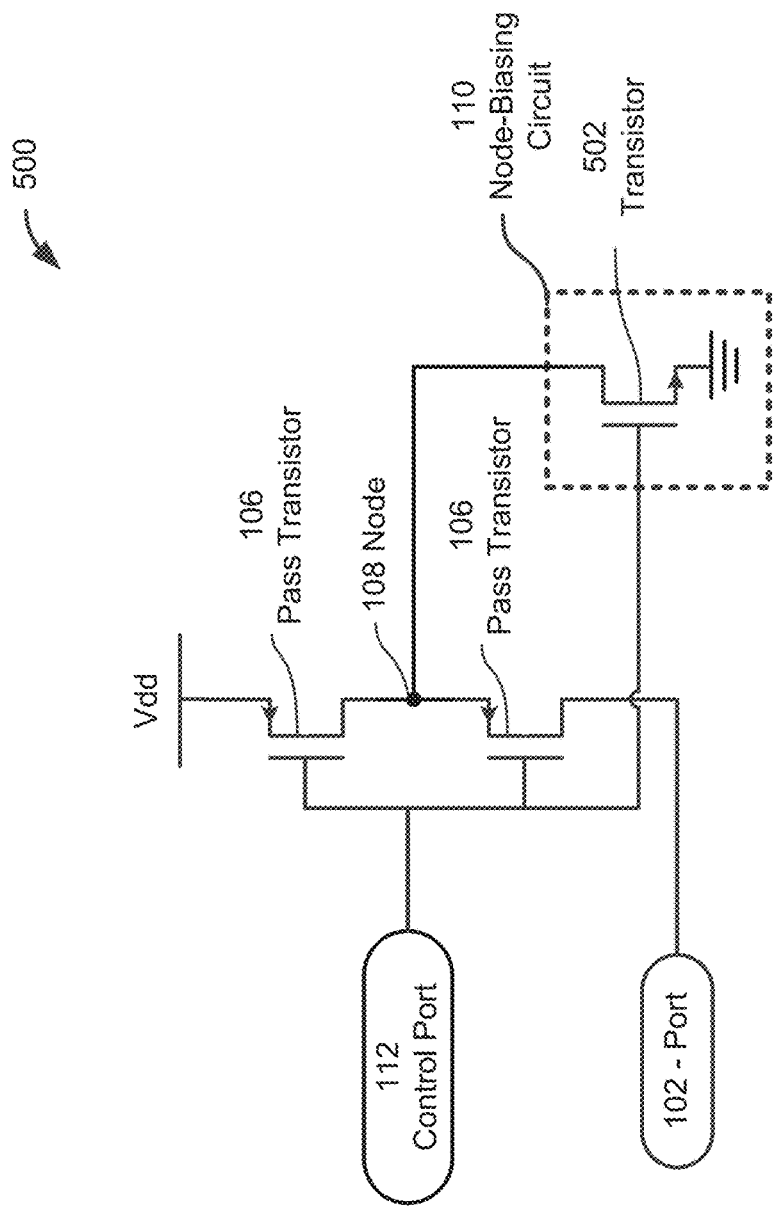
FIG. 5 is a diagram showing an example low-leakage pullup switch, according to some embodiments.

In some embodiments, the low-leakage switches disclosed herein may be implemented as pullup switches. In these embodiments, the port 102 may be coupled to the node that may be pulled to a supply voltage by the pullup switch and the port 104 may be coupled to the supply voltage. Thereby, the pullup switch may selectively couple a node to a supply voltage with minimal leakage current from the supply voltage to the node when the switch is turned off. An example of such a pullup switch is shown by pullup switch 500 in FIG. 5. As shown, the pullup switch 500 includes two PMOS pass transistors 106 coupled between the supply voltage $V_{dd}$ and the port 102, a node 108, and a node-biasing circuit 110 including an NMOS transistor 502 coupled between the node 108 and ground.

The low-leakage switches disclosed herein may be used in any of a variety of electronic devices. Example devices in which the low-leakage switches disclosed herein may be employed include the low noise, low drift, low power 3-axis accelerometer ADXL354/ADXL355 designed by ANALOG DEVICES of Norwood, Mass. and the low noise, high g, low power, low drift 3-axis accelerometer ADXL356/ADXL357 designed by ANALOG DEVICES.

Figure 6:
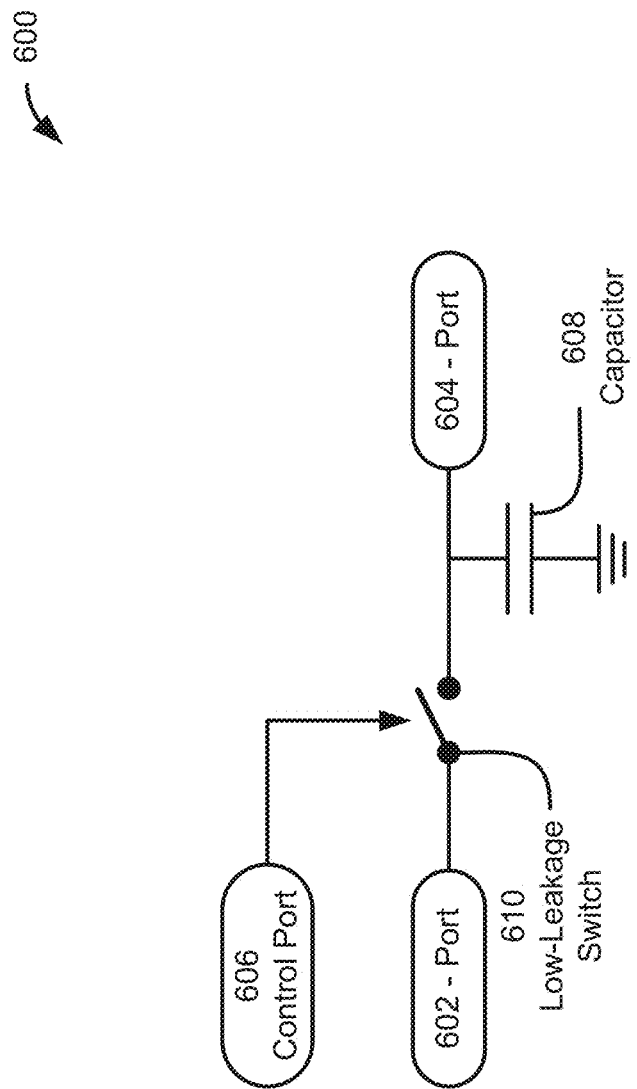
FIG. 6 is a diagram showing an example sample and hold circuit, according to some embodiments.

In some embodiments, a low-leakage switch as described herein may be employed in a sample and hold circuit. In these embodiments, the sample and hold circuit may be formed by, for example, coupling a capacitor to one of the ports of the low-leakage switch. An example of such a sample and hold circuit is shown in FIG. 6 by sample and hold circuit 600. As shown, the sample and hold circuit 600 includes ports 602 and 604, a control port 606, a capacitor 608, and a low-leakage switch 610.

The ports 602 and 604 may couple the sample and hold circuit 600 to other components within a device. In some embodiments, the ports 602 and 604 may be part of a signal path in a device. For example, the port 602 may receive an input signal for an amplifier and the port 604 may provide the received input signal to the amplifier.

The low-leakage switch 610 may selectively couple the port 602 to the port 604. The low-leakage switch may be, for example, any of the low-leakage switches disclosed herein. The state of the low-leakage switch 610 may be controlled by a control signal received via the control port 606. For example, the low-leakage switch 610 may close responsive to the control signal being in the first state and may open responsive to the control signal being in a second state.

The sample and hold circuit 600 may operate by turning the low-leakage switch 610 on during sample periods to charge the capacitor 608 and turning off the low-leakage switching 610 during hold periods to hold the charge on the capacitor 608. Employing any of the low-leakage switches as disclosed herein as low-leakage switch 610 advantageously decreases the leakage current through the low-leakage switch 610 from the capacitor 608 during the hold periods. Thereby, the capacitor 608 discharges at a slower rate. Accordingly, the sample and hold circuit 600 may be able to remain in the hold period for a longer period of time and/or employ a smaller capacitor 608.

Figure 7:
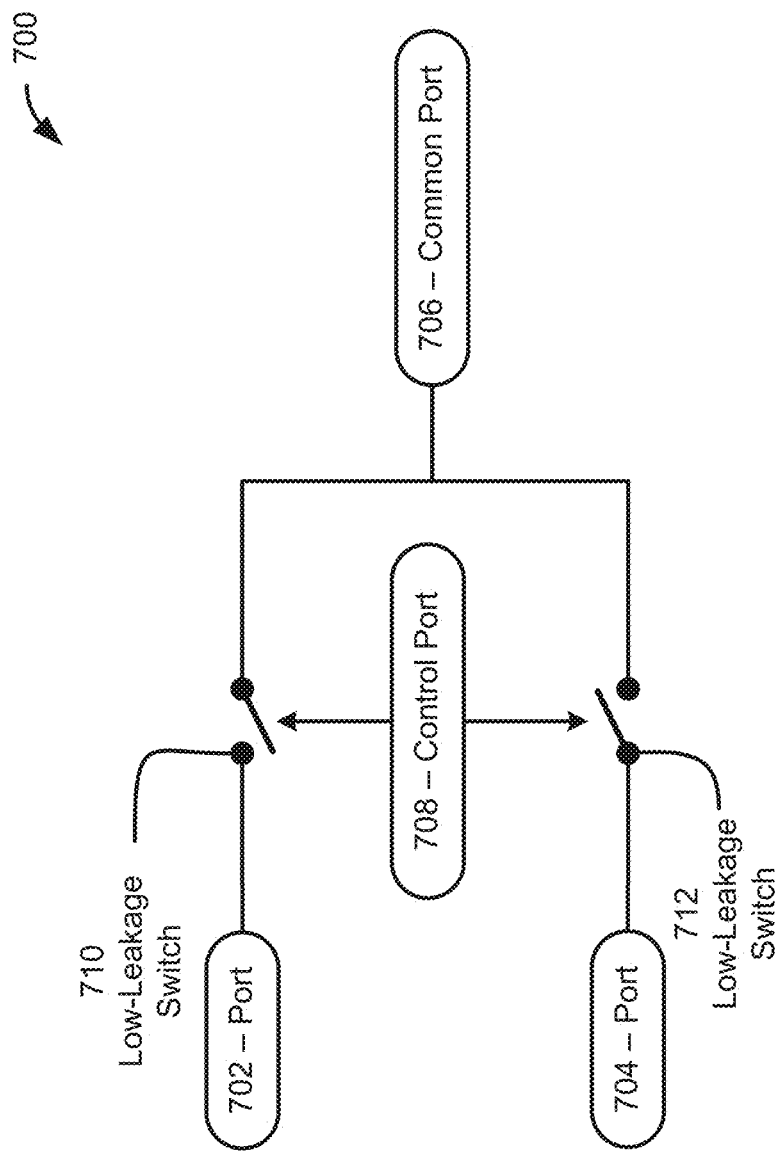
FIG. 7 is a diagram showing an example single-pole double-throw (SPDT) switch, according to some embodiments.

The low-leakage switches as described herein may be employed in to form various switching devices such as a single-pole double-throw (SPDT) switch and a double-pole double-throw (DPDT) switch. In some embodiments, a SPDT switch may be formed by, for example, coupling two low-leakage switches together in series between two ports and coupling a node between the two low-leakage switches to a common port. An example of such a SPDT switch is shown in FIG. 7 by SPDT switch 700. As shown, the SPDT switch 700 includes ports 702 and 704, a common port 706, a control port 708, and low-leakage switches 710 and 712. It should be appreciated that the low-leakage switches 710 and 712 may be, for example, any of the low-leakage switches disclosed herein.

The port 702 may be selectively coupled to the common port 706 by the low-leakage switch 710. Similarly, the port 704 may be selectively coupled to the common port by the low-leakage switch 712. The state of the low-leakage switches 710 and 712 may be controlled by one or more control signals received from the control port 708. For example, each of the low-leakage switches 710 and 712 may close responsive to receiving a control signal in a first state and may open responsive to receiving a control signal in a second state.

The SPDT switch 700 may operate by selectively coupling one of the ports 702 and 704 to the common port 706. For example, the SPDT switch 700 may have a first state where the port 702 is coupled to the common port 706 and a second state where the port 704 to the common port 706. The current operating state of the SPDT switch 700 may be controlled by the control signal(s) received via the control port 708. In some embodiments, the SPDT switch 700 may receive a separate control signal for each of the low-leakage switches 710 and 712. The separate control signals may couple the port 702 to the common port 706 by instructing the low-leakage switch 710 to close and the low-leakage switch 712 to open. Similarly, the separate control signals may couple the port 704 to the common port 706 by instructing the low-leakage switch 710 to open and the low-leakage switch 712 to close.

It should be appreciated that the spar switch 700 may control operation of both low-leakage switches 710 and 712 with a single control signal. For example, the SPDT switch 700 may include an inverter to generate an inverted control signal. In this example, the SPDT switch 700 may provide the control signal to one of the low-leakage switches 710 and 712 and provide the inverted control signal to the other low-leakage switch. In another example, the low-leakage switches 710 and 712 may be constructed to react differently to each state of the control signal. For example, the low-leakage switch 710 may be constructed to turn on when the control signal is in a first state while the low-leakage switch 712 may be constructed to turn off when the control signal is in the first state. Further, the low-leakage switch 710 may be constructed to turn off when the control signal is in a second state while the low-leakage switch 712 may be constructed to turn on when the control signal is in the second state. Thereby, the same control signal may be provided to both low-leakage switches 710 and 712.

Figure 8:
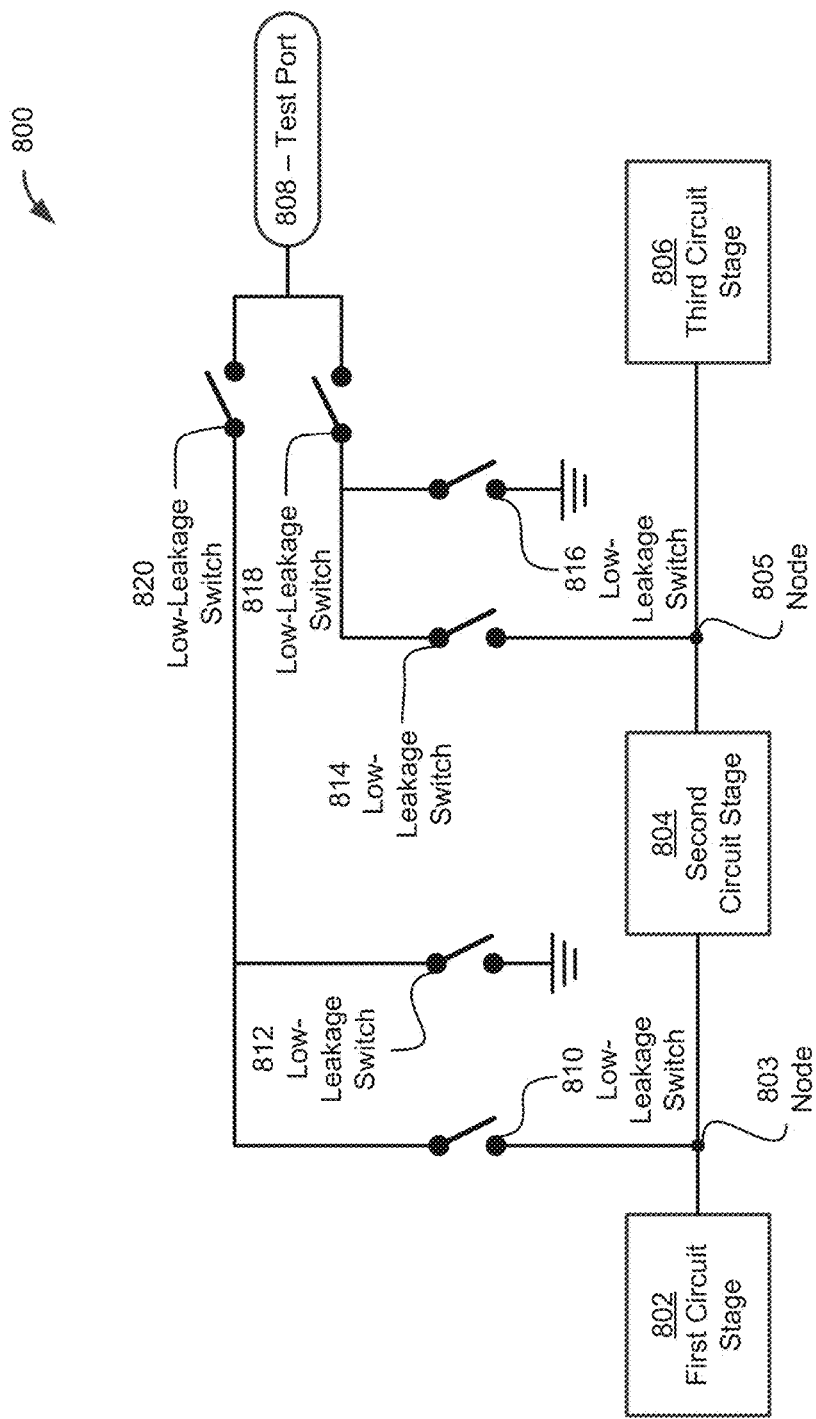
FIG. 8 is a diagram showing an example test multiplexer, according to some embodiments.

In some embodiments, low-leakage switches as described herein may be employed in a test multiplexer. In these embodiments, the test multiplexer may be formed by, for example, coupling low-leakage switches between nodes of interest in a circuit being tested and a test port. An example of such a test multiplexer is shown in FIG. 8 by test multiplexer 800. As shown, the test multiplexer 800 includes a test port 808 that provides a signal from either node 803 that is between a first circuit stage 802 and a second circuit stage 804 or node 805 that is between the second circuit stage 804 and a third circuit stage 806. The test port 808 is selectively coupled to the nodes 803 and 805 by a network of low-leakage switches 810, 812, 814, 816, 818, and 820. The low-leakage switches 810, 812, 814, 816, 818, and 820 may be, for example, any of the low-leakage switches disclosed herein. It should be appreciated that the test multiplexer 800 may further include one or more control ports (not illustrated) to receive control signals that control operation of the network of low-leakage switches 810, 812, 814, 816, 818, and 820.

The circuit stages 802, 804, and 806 may be circuits that are to be investigated through the test multiplexer. For example, the output signal of the first circuit stage 802 at node 803 and/or the output signal of the second circuit stage 804 at node 805 may be routed to the test port 808. These signals may, in turn, be used to analyze the performance of one or more of the circuit stages 802, 804, and 806.

The low-leakage switches 810, 812, and 820 may be controlled to selectively couple the node 803 to the test port 808. For example, the node 803 may be coupled to the test port 808 by closing low-leakage switches 810 and 820 in addition to opening low-leakage switch 812. Conversely, the test port 808 may be decoupled from the node 803 by opening low-leakage switches 810 and 820 in addition to closing the low-leakage switch 812. Closing the low-leakage switch 812 when the low-leakage switches 810 and 820 are open grounds the node between the low-leakage switches 810 and 820 that would otherwise be left floating.

The low-leakage switches 814, 816, and 818 may be controlled in a similar fashion as low-leakage switches 810, 812, and 820 described above to selectively couple the node 805 to the test port 808. For example, the node 805 may be coupled to the test port 808 by closing low-leakage switches 814 and 818 in addition to opening low-leakage switch 816. Conversely, the test port 808 may be decoupled from the node 805 by opening low-leakage switches 814 and 818 in addition to closing the low-leakage switch 816. Closing the low-leakage switch 816 when the low-leakage switches 814 and 818 are open grounds the node between the low-leakage switches 814 and 818 that would otherwise be left floating.

Figure 9:
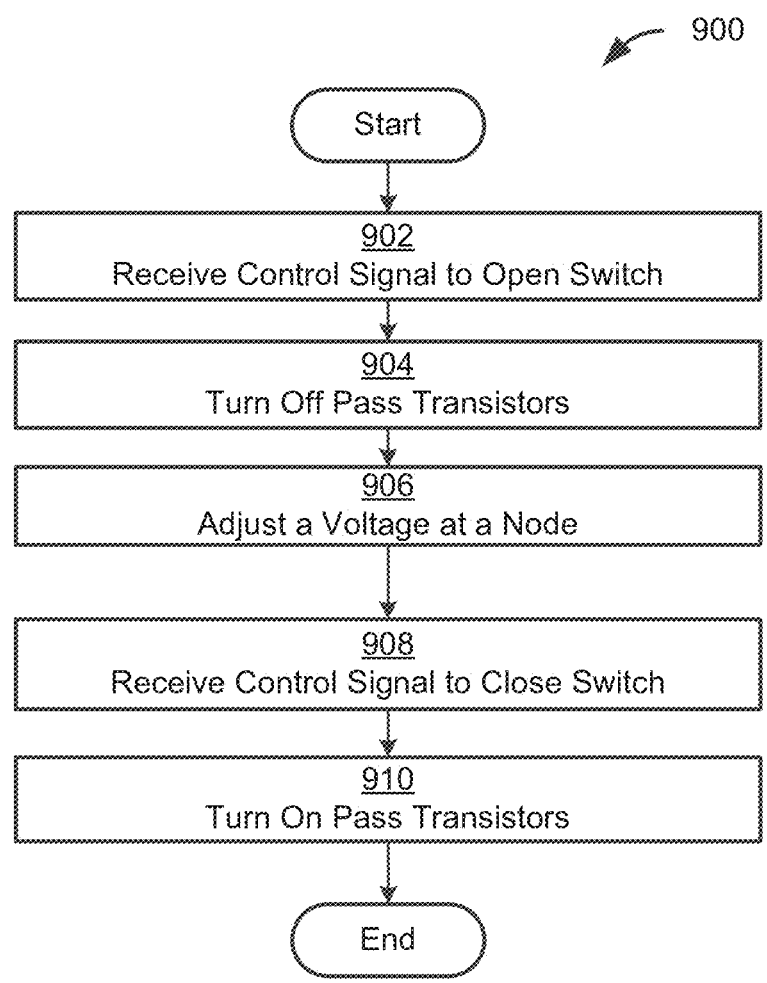
FIG. 9 is a flowchart showing an example method of operation of a low-leakage switch, according to some embodiments.

As discussed above, a low-leakage switch is disclosed herein that may be used in a variety of devices, such as sample and hold circuit. These low-leakage switches may perform various processes to, for example, close or open the switch. An example of such a process to open and close a low-leakage switch is shown in FIG. 9 by process 900. The process 900 includes an act 902 of receiving a control signal to open the switch, an act 904 of turning off the pass transistors, an act 906 of adjusting a voltage at a node, an act 908 of receiving a control signal to close the switch, and an act 910 of turning off the pass transistors.

In act 902, the low-leakage switch may receive a control signal to open the low-leakage switch. For example, the low-leakage switch may receive a control signal that is in a low state from a controller or other device.

In act 904, the low-leakage switch may turn off the pass transistors responsive to receiving the control signal to impede current flow between the ports of the low-leakage switch. For example, the control signal may be applied to the gate terminals of the pass transistors to turn off the pass transistors.

In act 906, the low-leakage switch may adjust a voltage at a node between two pass transistors responsive to receiving the control signal to reduce the leakage current in the pass transistors. For example, the low-leakage switch may adjust the voltage at the node such that a terminal of at least one of the plurality of pass transistors that is coupled to the node becomes a drain terminal. In cases where the pass transistors are NMOS transistors, the low-leakage switch may increase the voltage at the node to cause the terminal of at least one pass transistor that is coupled to the node to become the drain terminal and drive the gate-to-source voltage of the pass transistors negative. In cases where the pass transistors are PMOS transistors, the low-leakage switch may decrease the voltage at the node to cause the terminal of at least one pass transistor that is coupled to the node to become the drain terminal and increase the gate-to-source voltage of the pass transistors.

In act 908, the low-leakage switch may receive a control signal to close the low-leakage switch. For example, the low-leakage switch may receive a control signal that is in a high state from a controller or other device.

In act 910, the low-leakage switch may turn on the pass transistors responsive to receiving the control signal to allow current to flow between the ports of the low-leakage switch.

For example, the control signal may be applied to the gate terminals of the pass transistors to turn on the pass transistors.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A low-leakage switch, comprising:
  a first port and a second port;
  at least two n-type pass transistors coupled between the first port and the second port, the at least two n-type pass transistors comprising a first n-type pass transistor having a source terminal coupled to a first node and a second n-type pass transistor having a source terminal coupled to the first node; and
  a first node-biasing circuit coupled to the first node and configured to adjust a gate-to-source voltage of the first and second n-type pass transistors responsive to the at least two n-type pass transistors being turned off, the first node-biasing circuit including a first p-type transistor coupled to the first node, a second p-type transistor coupled in series with the first p-type transistor, and a first n-type transistor having a terminal coupled between the first and second p-type transistors.

2. The switch of claim 1, wherein the first node-biasing circuit is further configured to turn on the first and second p-type transistors and turn off the first n-type transistor responsive to the at least two n-type pass transistors being turned off.

3. The switch of claim 2, wherein the first node-biasing circuit is further configured to turn off the first and second p-type transistors and turn on the first n-type transistor responsive to the at least two n-type pass transistors being turned on.

4. The switch of claim 1, wherein the second p-type transistor is coupled to a voltage that is greater than or equal to a highest expected voltage at the first port or the second port and wherein the first node-biasing circuit is further configured to increase a voltage at the first node responsive to the at least two n-type pass transistors being turned off.

5. The switch of claim 1, further comprising at least two p-type pass transistors coupled between the first port and the second port and a second node biasing circuit coupled to a second node between the at least two p-type pass transistors and configured to adjust a voltage at the second node responsive to the at least two p-type pass transistors being turned off.

6. The switch of claim 5, wherein the second node biasing circuit includes a second n-type transistor coupled to the second node, a third n-type transistor coupled in series with the second n-type transistor, and a third p-type transistor having a terminal coupled between the second and third n-type transistors.

7. The switch of claim 6, wherein the third n-type transistor is coupled to a voltage that is less than or equal to a lowest expected voltage at the first port or the second port and wherein the second node biasing circuit is further configured to decrease the voltage at the second node responsive to the at least two p-type pass transistors being turned off.

8. The switch of claim 6, wherein the second node-biasing circuit is further configured to turn on the second and third n-type transistors and turn off the third p-type transistor responsive to the at least two p-type pass transistors being turned off.

9. The switch of claim 8, wherein the second node-biasing circuit is further configured to turn off the second and third n-type transistors and turn on the third p-type transistor responsive to the at least two p-type pass transistors being turned on.

10. A low-leakage switch, comprising:
  a first port and a second port;
  at least two p-type pass transistors coupled between the first port and the second port, the at least two p-type pass transistors comprising a first p-type pass transistor having a source terminal coupled to a node and a second p-type pass transistor having a source terminal coupled to the node; and
  a node-biasing circuit coupled to the node and configured to adjust a gate-to-source voltage of the first and second p-type pass transistors responsive to the at least two p-type pass transistors being turned off, the node-biasing circuit including a first n-type transistor coupled to the node, a second n-type transistor coupled in series with the first n-type transistor, and a p-type transistor having a terminal coupled between the first and second n-type transistors.

11. The switch of claim 10, wherein the node-biasing circuit is further configured to turn on the first and second n-type transistors and turn off the p-type transistor responsive to the at least two p-type pass transistors being turned off.

12. The switch of claim 11, wherein the node biasing circuit is further configured to turn off the first and second n-type transistors and turn on the p-type transistor responsive to the at least two p-type pass transistors being turned on.

13. The switch of claim 10, wherein the second n-type transistor is coupled to a voltage that is less than or equal to a lowest expected voltage at the first port or the second port and wherein the node biasing circuit is further configured to decrease a voltage at the node responsive to the at least two p-type pass transistors being turned off.

14. A sample and hold circuit including a sample mode of operation and a hold mode of operation, comprising:
  a first port and a second port;
  a capacitor coupled to the second port; and
  a switch coupled between the first port and the capacitor, the switch including:
    at least two pass transistors coupled between the first port and the second port, the at least two pass transistors including a first pass transistor having a source terminal coupled to a node and a second pass transistor having a source terminal coupled to the node; and
    a node-biasing circuit coupled to the node and configured to adjust a gate-to-source voltage of the first and second pass transistors responsive to the at least two pass transistors being turned off, the node-biasing circuit including a first transistor coupled to the node, a second transistor coupled in series with the first transistor, and a third transistor having a terminal coupled between the first and second transistors.

15. The circuit of claim 14, further comprising a control port to receive a control signal having a first state and a second state and wherein the sample and hold circuit is configured to operate in sample mode responsive to the control signal being in the first state and operate in hold mode responsive to the control signal being in the second state.

16. The circuit of claim 15, wherein each of the at least two pass transistors includes a gate terminal coupled to the control port to receive the control signal and wherein the at least two pass transistors are configured to turn on responsive to the control signal being in the first state and turn off responsive to the control signal being in the second state.

17. The circuit of claim 14, wherein the node-biasing circuit is further configured to turn on the first and second transistors and turn off the third transistor responsive to the sample and hold circuit being in the hold mode of operation.

18. The circuit of claim 17, wherein the node-biasing circuit is further configured to turn off the first and second transistors and turn on the third transistor responsive to the sample and hold circuit being in the sample mode of operation.

19. The circuit of claim 14, wherein the at least two pass transistors are n-type transistors, the first and second transistors are p-type transistors, and the third transistor is an n-type transistor.

20. The circuit of claim 14, wherein the at least two pass transistors are p-type transistors, the first and second transistors are n-type transistors, and the third transistor is a p-type transistor.

* * * * *